(12) United States Patent
Rissing et al.

(10) Patent No.: US 7,518,157 B2
(45) Date of Patent: Apr. 14, 2009

(54) OPTOELECTRONIC COMPONENT ASSEMBLY

(75) Inventors: Lutz Rissing, Seebruck (DE); Jan Braasch, Altenmarkt (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 2 days.

(21) Appl. No.: 10/964,398

(22) Filed: Oct. 12, 2004

(65) Prior Publication Data

US 2005/0098472 A1 May 12, 2005

(30) Foreign Application Priority Data

Nov. 8, 2003 (DE) .................... 103 52 285

(51) Int. Cl.
*H01L 23/10* (2006.01)

(52) U.S. Cl. .................... 257/98; 257/100; 257/704

(58) Field of Classification Search ............... 257/678, 257/79, 95, 98–100, 81, 82, 680, 705, 704, 257/710; 438/106, 116, 118, 127

See application file for complete search history.

(56) References Cited

U.S. PATENT DOCUMENTS

| 4,700,065 | A | 10/1987 | Kordulla et al. |
| 4,769,344 | A * | 9/1988 | Sakai et al. .................... 29/827 |
| 5,283,434 | A | 2/1994 | Ishizuka et al. |
| 5,995,229 | A | 11/1999 | Omi |
| 6,034,429 | A * | 3/2000 | Glenn et al. ................. 257/701 |
| 6,483,030 | B1 * | 11/2002 | Glenn et al. ................. 174/521 |
| 6,525,405 | B1 * | 2/2003 | Chun et al. .................. 257/666 |
| 6,603,114 | B1 * | 8/2003 | Holzapfel et al. ....... 250/231.14 |
| 6,745,449 | B2 * | 6/2004 | Hanna et al. .................... 29/458 |
| 2003/0133479 | A1 * | 7/2003 | Morikawa et al. ............. 372/36 |
| 2004/0190304 | A1 * | 9/2004 | Sugimoto et al. ........... 362/555 |
| 2004/0256628 | A1 * | 12/2004 | Chin et al. ..................... 257/98 |
| 2005/0072981 | A1 * | 4/2005 | Suenaga ....................... 257/88 |

FOREIGN PATENT DOCUMENTS

| DE | 198 43 155 | 4/1999 |
| EP | 0 184 628 | 1/1991 |
| JP | 06-021414 | * 1/1994 |
| JP | 09-189514 | 7/1997 |
| WO | WO 03/010832 | 2/2003 |

* cited by examiner

*Primary Examiner*—Phat X Cao
*Assistant Examiner*—Abul Kalam
(74) *Attorney, Agent, or Firm*—Kenyon & Kenyon LLP

(57) ABSTRACT

Optoelectronic component assemblies include a carrier element having a recess, the recess having at least one stepped supporting surface in the region of its periphery at a defined height between the bottom of the recess and the top edge of the recess. Arranged above the optoelectronic component in the region of the recess is a transparent cover element which has a structuring in at least one partial area. The cover element rests in the region of the supporting surface and is secured in this region by a bonding material. The upper side of the cover element may project above the top edge of the recess. Different materials may be provided as an encapsulation material and a bonding material.

18 Claims, 3 Drawing Sheets

OPTOELECTRONIC COMPONENT ASSEMBLY

CROSS-REFERENCE TO RELATED APPLICATIONS

The present application claims priority to Application No. 103 52 285.9, filed in the Federal Republic of Germany on Nov. 8, 2003, which is expressly incorporated herein in its entirety by reference thereto.

FIELD OF THE INVENTION

The present invention relates to an optoelectronic component assembly, which may be usable, e.g., in the scanning unit of an optical position-measuring device.

BACKGROUND INFORMATION

An optoelectronic component assembly is described, for example, in U.S. Pat. No. 5,283,434. The component assembly is used in the compact scanning unit of an optical position-measuring device, with the aid of which a measuring graduation is scanned and scanning signals, modulated as a function of displacement, are generated. The component assembly illustrated in FIG. 1c includes a carrier structure, called carrier element in the following, made of ceramic and having a recess, an optoelectronic component in the form of a light source configured as an LED being positioned in the central bottom region of the recess. Adjacent thereto, further optoelectronic components taking the form of photoelements are placed in the region of the recess. A transparent cover element formed as a glass plate is arranged over the recess. In several partial areas, the cover element has structurings in the form of periodic diffraction-grating structures. They act as a transmitting graduation in front of the LED and as scanning graduations in front of the photoelements.

An optoelectronic component assembly arranged in this manner may have a number of disadvantages. The complete ceramic carrier element having the various elements must be arranged i.e., adjusted on another carrier for further placement in the scanning unit of an optical position-measuring device. Significant expenditure with respect to precise adjustment of the complete component assembly in several method steps therefore results during manufacture and assembly. Moreover, a number of complicated adjustment processes are also necessary within the component assembly. In particular, the precise relative positioning of the cover element and the structurings arranged thereon in relation to the various optoelectronic components requires a high expenditure on the assembly side. Another disadvantage of this component assembly is that, altogether, a relatively high system results, which may lead to damage if the scanning distances between the scanning unit and the scale are small.

A further optoelectronic component assembly from the scanning unit of an optical position-measuring device is described in Japanese Published Patent Application No. 9-189514. The component is arranged on a carrier element and is surrounded by a circumferential frame or dam. A partial area of the component surface is covered by a glass plate resting thereon. The inner space of the dam is also filled with a sealing compound. A disadvantage in this is that, particularly in the boundary region between the glass plate and the sealing compound, an unwanted ion diffusion may take place in the direction of the component and influence it disadvantageously. Moreover, in response to temperature fluctuations, the adhesion bond in the boundary region does not satisfy the mechanical demands because of different expansion coefficients.

Another optoelectronic component assembly is described in European Published Patent Application No. 0 184 628. Reference is made in particular to FIG. 3. Problems with respect to the correct adjustment of the cover element in relation to the further components results in this assembly, as well.

In addition, reference is made, for example, to FIG. 1B of German Published Patent Application No. 198 43 155.

In summary, the approaches mentioned for optoelectronic component assemblies may not be optimal with respect to the necessary adjustment of the cover element and possibly with respect to the adjustment of the complete component assembly, as well as with respect to its protection from environmental influences during actual operation.

SUMMARY

According to an example embodiment of the present invention, an optoelectronic component assembly may ensure simple manufacture as well as reliable operation, e.g., in the scanning unit of an optical position-measuring device.

According to an example embodiment of the present invention, a carrier element, configured, for example, as a printed-circuit board, is used for receiving the at least one component and the cover element. In this context, the cover element rests on a stepped supporting surface in the region of the periphery of the recess, and is secured in this region by a suitable bonding material. The cover element projects with its upper side above the top edge of the recess.

According to an example embodiment of the present invention, the carrier element, configured, for example, as a printed-circuit board, is used for receiving the at least one component and the cover element. The cover element rests on a stepped supporting surface in the region of the periphery of the recess, and is secured in this region by a suitable bonding material. Adjacent to the edge of the cover element, a chemically resistant encapsulation material is applied in the region of the supporting surface. In this context, the bonding material and the encapsulation material are selected independently of each other.

In addition to great insensitivity to environmental influences, the component assemblies may also ensure easy manufacture of the same.

Thus, the interior space of the recess of the component assembly may be reliably sealed against oil, water and other liquids. In addition to imperviousness during actual operation, it may be ensured that, if necessary, the cover element may easily be cleansed using washes and/or solvents. The optoelectronic component may not be damaged in so doing.

The encapsulation of the recess interior space may be optimized by the suitable selection of a chemically resistant encapsulation material which surrounds the cover element in the bearing region. Unwanted ion diffusion into the interior space may also be prevented by a suitable selection of the encapsulation material. This ion diffusion may have a disruptive effect on the properties of the optoelectronic component. Thus, according to an example embodiment of the present invention, a suitable bonding material—e.g., a suitable adhesive—by which the cover element is secured on the supporting surface may be selected independently of the selection of an optimized encapsulation material. Based on the measures hereof, it may be possible to select a suitable material in each case for the different demands with respect to environmental resistance and optimal securing, including possible adjustment of the cover element.

Moreover, the ability of the cover element to be positioned within predefined limits may be easily ensured by the suitable dimensioning of the geometry of the stepped supporting surface and the selected thickness of the cover element. Thus, the edges of the upper side of the cover element projecting beyond the top edge of the recess may be used for adjusting the cover element. This may be critical when the cover element has structurings that must be correctly positioned with respect to the optoelectronic component in the recess. In the event of such a necessary adjustment, the cover-element edge may therefore be used as a stop edge for the correct spatial alignment when, for example, the cover element is already roughly fixed in position by a suitably selected bonding material, and is still able to be correctly aligned before the final curing of the bonding material. In an alternative adjustment arrangement, using a suitable positioning device and with the aid of the stop edge(s), the cover element may first be precisely positioned and then lowered onto the supporting surface having the bonding material. Simple adjustment possibilities, e.g., for the cover element, thus may also result.

Furthermore, such an edge may also be used for the precise positioning of the complete component assembly when, for example, the component assembly is to be installed in a positionally precise manner in a device.

The component assembly may be used in the scanning unit of an optical position-measuring device.

According to an example embodiment of the present invention, an optoelectronic component assembly includes: a carrier element including a recess, the recess having at least one stepped supporting surface in a peripheral region at a defined height between a bottom of the recess and a top edge of the recess; an optoelectronic component arranged in the recess; and a transparent cover element arranged in the recess above the optoelectronic component, the transparent cover element including a structuring in at least one partial area and resting in a region of the supporting surface, an upper side of the transparent cover element projecting above the top edge of the recess.

The stepped supporting surface may be dimensioned so that the cover element is positionable in a defined manner on the stepped supporting surface within predefined limits.

A distance of the supporting surface from the top edge of the recess and a thickness of the transparent cover element may be configured so that a fraction of the thickness of the transparent cover element projects above the top edge of the recess.

The optoelectronic component assembly may include a chemically resistant encapsulation material applied adjacent to an edge of the transparent cover element in a region of the supporting surface.

The encapsulation material on the carrier element may surround the transparent cover element, and the encapsulation material may be substantially even with the transparent cover element.

The transparent cover element may be secured in the region of the supporting surface by a bonding material.

The carrier element may include a ventilation hole in a region of the recess.

In one partial area, the structuring of the transparent cover element may be arranged as a periodic grating aligned in a defined manner with respect to a partial area of the optoelectronic component.

The transparent cover element may include a plane-parallel glass plate.

The structuring may include an adjustment marking.

According to an example embodiment of the present invention, an optoelectronic component assembly includes: a carrier element including a recess, the recess having at least one stepped supporting surface in a peripheral region at a defined height between a bottom of the recess and a top edge of the recess; an optoelectronic component arranged in the recess; a transparent cover element arranged in the recess above the optoelectronic component, the transparent cover element including a structuring in at least one partial area and resting in a region of the supporting surface, the transparent cover element secured in the region of the supporting surface by a bonding material; and a chemically resistant encapsulation material applied adjacent to an edge of the transparent cover element in the region of the supporting surface.

The bonding material and the encapsulation material may be different materials.

The carrier element may include a ventilation hole in a region of the recess.

In one partial area, the structuring may be arranged as a periodic grating aligned in a defined manner with respect to a partial area of the optoelectronic component.

The transparent cover element may include a plane-parallel glass plate.

The bonding material may include a UV-curable adhesive.

The encapsulation material may include an epoxy resin.

The structuring may include an adjustment marking.

Other aspects and details pertaining are set forth below in the following description of exemplary embodiments with reference to the appended Figures.

DETAILED DESCRIPTION

Figure 1:
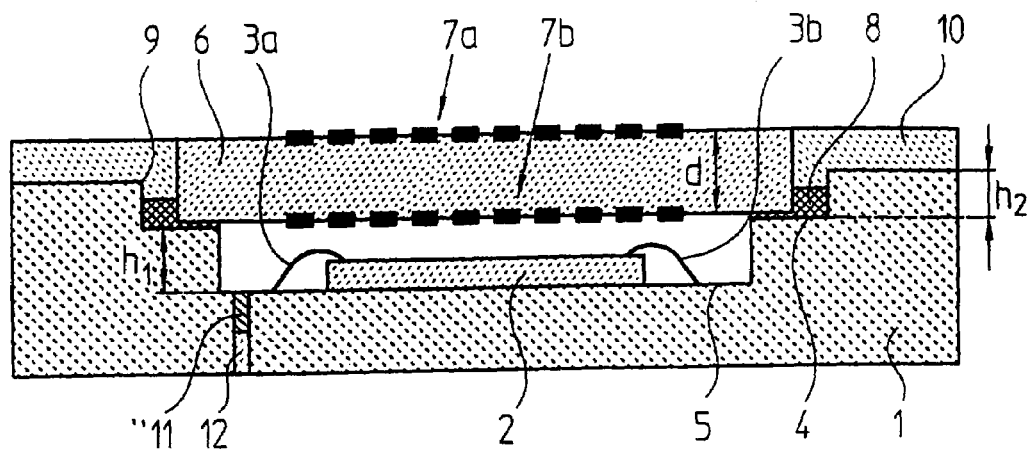
FIG. 1 is a schematic cross-sectional view of an optoelectronic component assembly according to an example embodiment of the present invention.

FIG. 1 is a cross-sectional view of an optoelectronic component assembly according to an example embodiment of the present invention. Such a component assembly is used, for example, in the scanning unit of an optical position-measuring device. A scale is scanned via the scanning unit for generating scanning signals as a function of displacement. The scale may have, for instance, one or more periodic incremental graduations, a code structure, etc. If a linear movement is to be detected, a linear scale is used. If a rotational movement is to be detected, the scale is arranged to be rotationally symmetrical.

The component assembly includes a carrier element 1 which, in an example embodiment, takes the form of a printed-circuit board and is made, for example, of FR4 material. Alternatively, a suitable ceramic or plastic material may also be provided as material for carrier element 1. When using a printed-circuit board as carrier element 1, it may also have a multilayer construction including a plurality of carrier-element layers having in each case a specific geometry.

The printed-circuit board or carrier element 1 acts in the scanning unit as a scanning board that is arranged in a manner permitting movement relative to the scanned scale. Arranged on carrier element 1 for generating the displacement-dependent scanning signals are various optoelectronic components such as, for example, a light source, one or more detector elements, opto-ASICs, as well as, optionally, further electronic components for the generation and further processing of signals. Particularly in the case of the optoelectronic component, it may be necessary that it is encapsulated as well as possible, so that its performance reliability is not impaired by environmental influences, e.g., oil or other liquids. In the component assembly illustrated, a so-called opto-ASIC is provided as optoelectronic component 2. It includes an optoelectronic detector system having one or more photodetectors, as well as further integrated electronic components for signal processing. Component 2 is positioned, for example, in a rectangular recess of carrier element 1, and is electroconductively connected to further printed conductors in carrier element 1 by bonding wires 3a, 3b.

The recess in carrier element 1 has, in the region of its periphery, an at least partially circumferential, stepped supporting surface 4.

When using a single-layer carrier element, the recess and the supporting surface are milled from the respective material. On the other hand, if the carrier element has a multilayer construction, then, for example, on the lowest carrier-element layer, a second carrier-element layer may have to be arranged, which has a recess dimensioned to be suitably large in the region of the component. The third carrier-element layer positioned thereon has, in the region of the component, a, for example, once again larger recess, so that as illustrated in FIG. 1, supporting surface 4 in the desired size and shape results. As an alternative to this arrangement, the carrier element may also be constructed as an injection-molded part.

Supporting surface 4 is set apart from bottom 5 of the recess at a height $h_1$, and from top edge 9 of the recess at a height $h_2$. A typical order of magnitude for height $h_1$ is $h_1=0.8$ mm, and for height $h_2$ is $h_2=0.5$ mm.

On supporting surface 4, a transparent cover element 6 is arranged above component 2 in the recess, that is to say, cover element 6 rests on supporting surface 4. Cover element 6 is formed, for example, as a plane-parallel glass plate. Alternatively, however, other transparent materials such as suitable plastic materials, etc., may also be considered for cover element 6. As FIG. 1 illustrates, cover element 6 has a structuring 7a, 7b in at least one partial area. Structuring 7a, 7b includes a periodic graduation structure having alternating transparent and non-transparent partial areas. The non-transparent partial areas are formed, for example, by chrome webs. While in the example illustrated in FIG. 1, cover element 6 has such a structuring 7a, 7b on its upper and lower sides, alternatively it may be provided to apply such a structuring 7a, 7b only on one side, for example, only on the lower side facing component 2. The latter arrangement may provide that the structuring is protected from external influences. In the present example, structuring 7a, 7b is used as a scanning structure in the generation of displacement-dependent scanning signals from the optical scanning of a scale.

Alternatively and/or in addition to the structuring, cover element 6 may also include differently configured, optically effective partial areas which, for example, have a focusing optical effect on the beams of rays passing through. Moreover, as structuring, for example, merely adjustment markings for the precise positioning of the cover element may also be provided, etc.

Cover element 6 is secured in the region of supporting surface 4 using a bonding material 8. In the case of an adhesive bond, UV-curable adhesives, for example, or adhesives whose hardening is induced by heat or laser may be suitable. For example, the material having the product name Amicon 50400-1 marketed by the firm Emerson & Cumming, or else the material having the product name Katiobond from the firm Delo may be suitable adhesives.

Alternatively, soldering of cover element 6 may also be provided as a bonding mechanism. A suitable soldering material then acts as bonding material 8 accordingly.

When selecting a suitable type of bonding, the selected bond between cover element 6 and carrier element 1 may ensure the greatest possible stability in the final state. Further demands on bonding material 8 may result with respect to the encapsulation time if, in the not yet cured state, for example, precise positioning of cover element 6 is still supposed to be possible. Moreover, the selection of a suitable bonding material 8 may also depend on whether it is optionally also used for filling up the interior space.

When selecting suitable materials for cover element 6 and bonding material 8, care may also be taken that their thermal expansion coefficients are adapted as well as possible to each other. In this manner, a stable and impervious bond may then be ensured, even under thermal stress.

When using such component assemblies in scanning units of optical position-measuring devices, it may be necessary to electrically ground structuring 7a, 7b. In this case, it may be provided to use as bonding material 8, an electroconductive adhesive which, on one hand, is in contact with structuring 7a, 7b, and on the other hand with electrical connections on the side of carrier element 1.

As illustrated in FIG. 1, supporting surface 4 of the component assembly according to an example embodiment of the present invention is arranged to be slightly larger than the area of cover element 6. That is, the area of supporting surface 4 is dimensioned so that cover element 6 is able to be positioned on it in a defined manner within specific limits. This may be important in the manufacturing method explained below, when cover element 6, and therefore, e.g., structuring 7a, 7b is adjusted as precisely as possible in relation to component 2.

Cover element 6, i.e., the plane-parallel glass plate, has a thickness d which is selected such that the upper side of cover element 6 extends out from carrier element 1 and projects above top edge 9 of the recess. Consequently, thickness d of cover element 6 may be selected to be greater than height $h_2$ which indicates the distance of supporting surface 4 from top edge 9 of the recess, i.e., $d>h_2$. A typical thickness d of cover element 6 is d=1.5 mm.

In the case of the necessary mounting of the component assembly in a device such as the scanning unit mentioned above, the resulting edges of cover element 6, which project beyond recess top edge 9, may also be used for adjusting and positioning cover element 6 as well as for the positionally precise mounting of the complete component assembly.

Precise adjustment of the cover element may be possible in the present example at least until, in the manufacturing process, chemically resistant encapsulation material 10 is positioned adjacent to the edge of cover element 6 in the region of supporting surface 4. In the exemplary embodiment illustrated, encapsulation material 10 surrounds cover element 6 so that it is level with it. At this point, widely varying epoxy resins may be used, for example, as encapsulation material 10. This encapsulation material 10 may ensure a particularly stable encapsulation of component 2, e.g., the greatest possible stability with respect to environmental influences such as oil or other liquids which may penetrate into the interior space of the recess and may damage the optoelectronic component. In addition to stability with respect to such environmental influences, great mechanical stability, good adhesion properties and good workability may also be considered when selecting encapsulation material 10.

In the area of the recess, adjacent to component 2, carrier element 1 also has a ventilation hole 11 which makes it possible to rinse the recess interior space with an inert gas prior to final sealing using a sealing element 12. The recess interior space is rinsed in order to prevent corrosion, e.g., of component 2, in this area which may impair functioning. Ventilation hole 11 is also used to reduce an excess pressure possibly building up in the recess interior space, e.g., in the case of thermal process steps during manufacture.

In the following, a method for producing a component assembly of an example embodiment of the present invention illustrated FIG. 1 is explained with reference to FIGS. 2a to 2e.

Figure 2A:
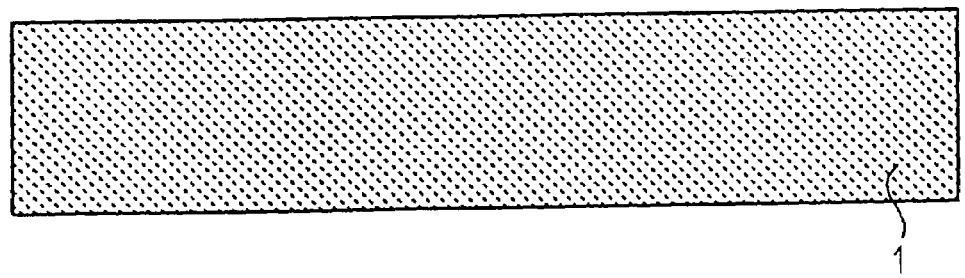
FIGS. 2a to 2e illustrate method steps for the production of the component assembly illustrated in FIG. 1.
Figure 2B:
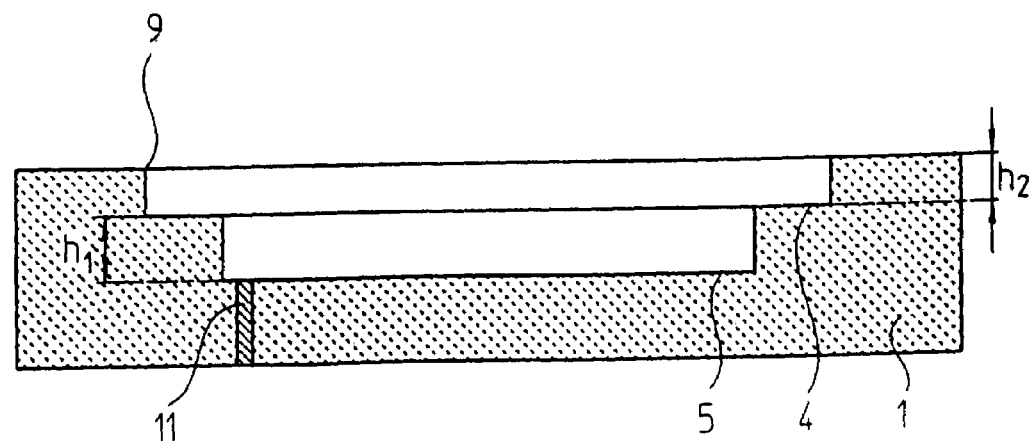

FIG. 2a illustrates carrier element 1 supplied, which in a first work step, is provided with a recess by milling, the recess having at least one stepped supporting surface 4 in the region of its periphery at a defined height $h_2$ above bottom 5 of the recess. The carrier element resulting after this work step is illustrated in FIG. 2b. As illustrated, a ventilation hole 11 is also introduced in the base of carrier element 1. The distance of supporting surface 4 from top edge 9 of the recess is designated by $h_2$.

As an alternative to processing by milling—as already indicated above—the carrier element may also have a multi-layer construction, for which a plurality of carrier-element layers made, for example, of FR4 material, each having a specific geometry, are positioned and bonded, respectively, one upon the other. In this case, the bottom carrier-element layer already has a ventilation hole. The carrier-element layers arranged above it each have recesses in specific sizes, so that the geometry illustrated in FIG. 2b results.

Figure 2C:
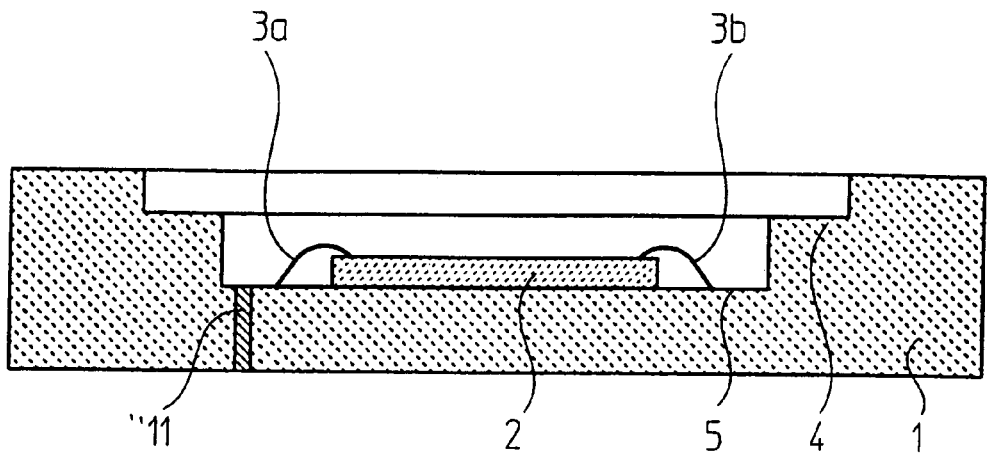

In the present example illustrated in FIG. 2c, optoelectronic component 2, e.g., an opto-ASIC, is subsequently arranged in the correct position in the recess and cemented to bottom 5 of the recess. The electrical contacting of component 2 is subsequently performed, for example, by a bonding process, in which suitable bonding wires 3a, 3b are installed between component 2 and carrier element 1 and contacts of electrical connecting leads arranged therein.

In principle, as an alternative to the procedure described, it may also be possible in the case of a multilayer construction, to first of all arrange the component on the bottom carrier-element layer and electrically contact the component, and only then to form the recess by arranging the two further carrier-element layers on the bottom carrier-element layer.

Alternatively, an electrical contacting may be implemented when, for example, a component in SMD construction is used, and then no separate bonding wires may be necessary.

After component 2 has been contacted, it may optionally be provided to embed component 2, for example, up to its top edge or possibly beyond it. This measure may minimize as much as possible the remaining volume in the interior space of the recess, which otherwise may have a negative effect on the stability of the total structure under thermal stress. It may thereby be possible to ensure stabilization of the bonding wires, as well as further improved protection against the possible penetration of foreign matter into the interior space.

Figure 2D:
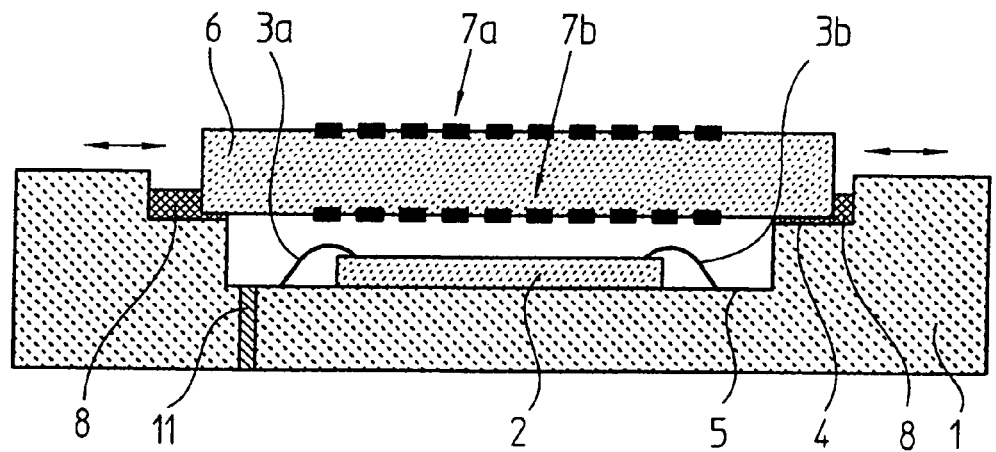

As illustrated in FIG. 2d, cover element 6, which, as explained above, has a structuring 7a, 7b in partial areas, is thereupon arranged in the region of the recess above optoelectronic component 2. In so doing, cover element 2 rests in the region of supporting surface 4 and is secured in this region by a bonding material 8. In the present example, cover element 6 is cemented to supporting surface 4 using a suitable adhesive as bonding material. In this context, the appropriate adhesive may be selected with respect to its adhesive and curing properties such that spatial positioning of cover element 6 on supporting surface 4 is still at least possible for a certain time. At the same time, however, sufficiently rapid fixation may be ensured.

As already mentioned above, cover element 6 has a thickness d, such that its upper side projects above top edge 9 of the recess.

The arrow in FIG. 2d indicates that in this step, a precise alignment or adjustment of cover element 6 and structuring 7a, 7b with respect to component 2 is performed. For this purpose, as indicated in the Figures, supporting surface 4 may be dimensioned to be somewhat larger than the surface of cover element 6. In addition to a structuring 7a, 7b, cover element 6 may also have other optically effective partial areas and/or adjustment markings.

For the necessary adjustment of cover element 6 with respect to component 2, in this manufacturing stage, the top edges of cover element 6 projecting beyond the recess may be used as stop edges.

Figure 2E:
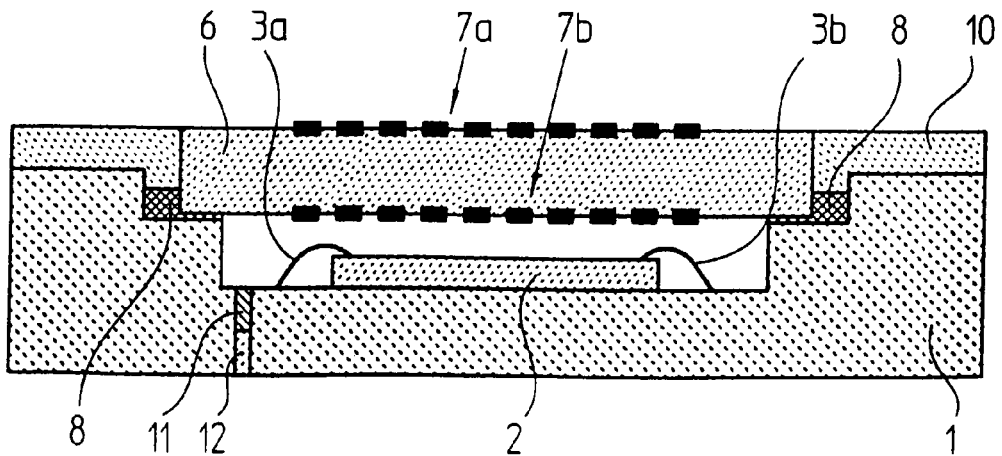

As illustrated in FIG. 2e, a chemically resistant encapsulation material 10 is subsequently applied adjacent to the edge of cover element 6 in the region of supporting surface 4 and adjoining carrier element 1. In the present example, this may be performed such that cover element 6 is surrounded by encapsulation material 10 on carrier element 1 such that encapsulation material 10 is level with cover element 6. During the corresponding encapsulation, the top edges of cover element 6 projecting beyond the recess may serve as flow edges which may ensure that no encapsulation material 10 gets into the region of structurings 7a and impairs their optical functionality.

Encapsulation material 10 may be selected so that it is optimized for the respective application. In this context, for example, it may be possible to optimize with respect to resistance to aggressive liquids which, for example, during operation may lead to an impairment of component 2 if they penetrate into the recess.

In principle, as an alternative, it may also be provided that encapsulation material 10 not terminate evenly with cover element 6, but rather that cover element 6 project slightly above the encapsulation compound. An exemplary embodiment of this type is explained below with reference to FIG. 3.

Prior to the final sealing of the recess interior space, it is rinsed with an inert gas via ventilation hole 11, in order to prevent unwanted corrosion in the recess interior space. In conclusion, ventilation hole 11 is sealed in the present exemplary embodiment by inserting a sealing element 12. In principle, however, it may also alternatively be provided not to seal the ventilation hole, to in this manner reduce excess pressure possibly occurring in the recess interior space during operation, etc.

Figure 3:
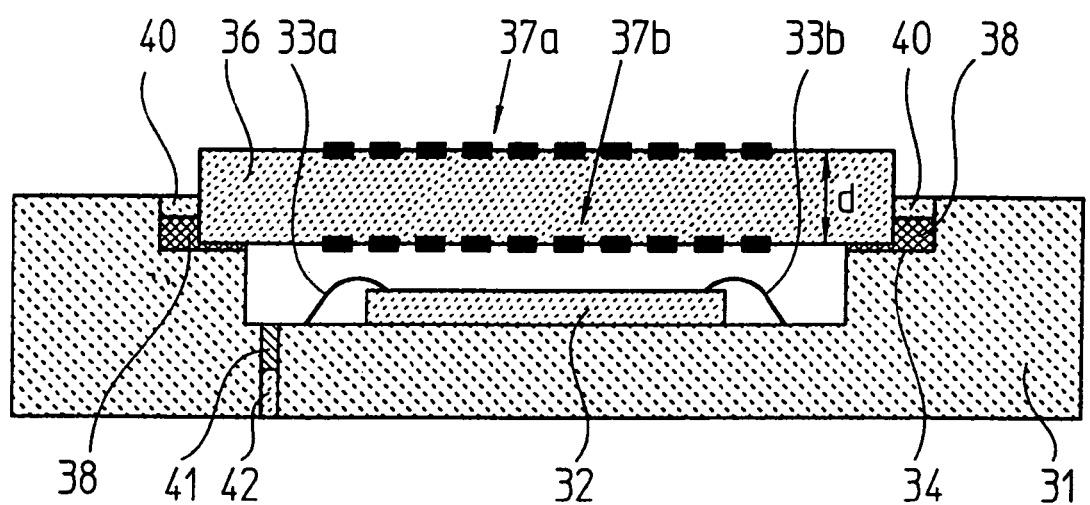
FIG. 3 is a schematic cross-sectional view of an optoelectronic component assembly according to an example embodiment of the present invention.

An alternative arrangement of a component assembly according is explained with reference to FIG. 3.

With respect to its construction, it corresponds substantially to the example illustrated in FIG. 1. That is why primarily the differences will be discussed in the following. Thus, in contrast to the arrangement described above, it is provided to embed cover element 36 adjacent to the recess with a encapsulation material 40 in a manner that encapsulation material 40 is not even with the upper edge of cover element 36. Rather, encapsulation material 40 is arranged only in the limited region above supporting surface 34. As in the previous example, cover element 36 is secured on the supporting surface by bonding material 38, for example, in the form of a suitable adhesive, e.g., a UV-curable adhesive. Bonding material 38 and encapsulation material 40 may be selected in optimized fashion, independently of each other. In this manner, both a bonding material 38 optimized with respect to curing properties, and therefore adjustment properties, as well as a encapsulation material 40 optimized with respect to its chemical resistance may be suitably selected.

In the present arrangement, as well, one or more edges of cover element 36 which project beyond carrier element 31 result in the final state. In turn, they may then act as stop edges or possibly adjustment edges for precise positioning of the total component assembly in a device.

In principle, however, it may also be provided within the framework hereof to select thickness d of cover element 36 such that in the mounted state, cover element 36 does not project or projects only extremely slightly beyond the top edge of the recess.

The arrangement of component 32 within the recess of carrier element 31, its contacting via bonding wires 33a, 33b and the provision of a ventilation hole 41 including seal 42 at the bottom of the recess, etc., may be identical to the arrangement described above.

Furthermore, for example, in addition to the opto-ASICs mentioned, many different optoelectronic components may be placed in the recess, for example, also light sources such as LEDs, laser diodes, etc. In this case, the structuring of the cover element may act as a so-called transmitting graduation, etc.

For the substantial filling in or encapsulation of the recess interior space, it is also possible to select a suitable bonding material as encapsulation material, to pour it in up to the supporting surface, for example, and then to mount the cover element on it.

What is claimed is:

1. An optoelectronic component assembly, comprising:
   a carrier element including a recess, the recess having at least one stepped supporting surface in a peripheral region at a defined height between a bottom of the recess and a top edge of the recess;
   an optoelectronic component arranged in the recess;
   a transparent cover element arranged in the recess above the optoelectronic component, the transparent cover element including a structuring in at least one partial area and resting in a region of the supporting surface, the structuring including a grating structure having a plurality of alternating transparent and non-transparent areas, the transparent cover element secured in the region of the supporting surface by a bonding material arranged in a region close to a lower edge of the transparent cover element; and
   a chemically resistant encapsulation material applied adjacent to an upper edge of the transparent cover element in the region of the supporting surface and extending into the recess between the supporting surface and the top edge of the recess.

2. The optoelectronic component assembly according to claim 1,
   wherein an upper side of the transparent cover element projects above the upper surface of the carrier element.

3. The optoelectronic component assembly according to claim 1, wherein the stepped supporting surface is dimensioned so that the cover element is positionable in a defined manner on the stepped supporting surface within predefined limits.

4. The optoelectronic component assembly according to claim 1, wherein a distance of the supporting surface from the upper surface of the carrier element and a thickness of the transparent cover element are configured so that a fraction of the thickness of the transparent cover element projects above the upper surface of the carrier element.

5. The optoelectronic component assembly according to claim 1, wherein the encapsulation material on the carrier element surrounds the transparent cover element, a top surface of the encapsulation material substantially even with a top surface of the transparent cover element.

6. The optoelectronic component assembly according to claim 1, wherein the bonding material and the encapsulation material are different materials selected in an optimized fashion independently from each other with respect to curing properties of the bonding material and chemical resistance of the encapsulation material.

7. The optoelectronic component assembly according to claim 1, wherein the carrier element includes a ventilation hole in a region of the recess.

8. The optoelectronic component assembly according to claim 1, wherein in one partial area, the grating structure is aligned in a defined manner with respect to a partial area of the optoelectronic component.

9. The optoelectronic component assembly according to claim 1, wherein the transparent cover element includes a plane-parallel glass plate.

10. The optoelectronic component assembly according to claim 1, wherein the bonding material includes a UV-curable adhesive.

11. The optoelectronic component assembly according to claim 1, wherein the encapsulation material includes an epoxy resin.

12. The optoelectronic component assembly according to claim 1, wherein the encapsulation material on the carrier element surrounds the transparent cover element, the encapsulation material substantially even with the transparent cover element to form a substantially flat top surface.

13. The optoelectronic component assembly according to claim 1, wherein the grating structure includes recessed portions and raised portions corresponding to the transparent and non-transparent areas.

14. The optoelectronic component assembly according to claim 1, wherein the grating structure includes grooves corresponding to at least one of the transparent and non-transparent areas.

15. The optoelectronic component assembly according to claim 1, wherein the grating structure is arranged on at least one surface of the transparent cover element.

16. The optoelectronic component assembly according to claim 1, wherein the chemically resistant encapsulation material prevents penetration of at least liquid into an interior space of the recess.

17. The optoelectronic component assembly according to claim 1, wherein the chemically resistant encapsulation material is adhesive.

18. The optoelectronic component assembly according to claim 1, wherein, in a final assembled state of the optoelectronic component assembly, the carrier element includes an exposed upper surface; and
   wherein, in the final assembled state of the optoelectronic component assembly, at least one edge of an upper side of the transparent cover element projects beyond the top edge of the recess and the exposed upper surface of the carrier element.

* * * * *